United States Patent
Zolotykh et al.

(10) Patent No.: US 6,470,487 B1
(45) Date of Patent: Oct. 22, 2002

(54) PARALLELIZATION OF RESYNTHESIS

(75) Inventors: Andrej A. Zolotykh, Moskovskaya Oblast (RU); Elyar E. Gasanov, Moscow (RU); Ivan Pavisic, San Jose, CA (US); Aiguo Lu, Cupertino, CA (US)

(73) Assignee: LSI Logic Corporation, Milpitas, CA (US)

( * ) Notice: Subject to any disclaimer, the term of this patent is extended or adjusted under 35 U.S.C. 154(b) by 50 days.

(21) Appl. No.: 09/842,350

(22) Filed: Apr. 25, 2001

(51) Int. Cl.[7] .............................................. G06F 17/50
(52) U.S. Cl. ....................................................... 716/18
(58) Field of Search ........................................... 716/18

(56) References Cited

PUBLICATIONS

Combining Technology Mapping with Post–Placement Resynthesis for Performance Optimization Aiguo Lu et al. Institute of Electronic Design Automation Technical University of Munich IEEE Catalog No.: 98CB36273.*
Using Precomputation in Architecture and Logic Resynthesis Soha Hassoun et al. IEEE Catalog No.: 98CB35287.*

* cited by examiner

Primary Examiner—Cuong Quang Nguyen
(74) Attorney, Agent, or Firm—Luedeka, Neely & Graham

(57) ABSTRACT

A method for resynthesizing a design of an integrated circuit using a parallel processing mode. A single processing mode is entered by activating a main thread and locking a semaphore associated with the main thread. The design of the integrated circuit is resynthesized using the main thread. Tasks to be accomplished in the parallel processing mode are identified. The semaphore associated with the main thread is unlocked, and the operation of the single processing mode is ceased. Ordinal threads are activated by unlocking a semaphore associated with each ordinal thread. The tasks are processed in parallel by assigning the tasks to the ordinal threads and the main thread. Upon completion of one of the assigned tasks by one of the ordinal threads, it is determined whether an additional task remains to be assigned. In the case where the additional task remains, the additional task is assigned to the completed one of the ordinal threads. In the case where the additional task does not remain, the completed one of the ordinal threads is inactivated. Upon inactivation of all of the ordinal threads, a return is made to the single processing mode, with the ordinal threads remaining inactive unless and until the main thread identifies more tasks to be accomplished in the parallel processing mode.

9 Claims, 3 Drawing Sheets

PARALLELIZATION OF RESYNTHESIS

FIELD

This invention relates to the field of integrated circuit design. More particularly the invention relates to optimizing integrated circuit design using parallel processing for various optimization tasks.

BACKGROUND

Microelectronic integrated circuits consist of a large number of electronic components, in which individual logic devices or groups of logic devices are applied to the surface of a substrate, typically a silicon wafer. Placement of the components of the integrated circuit in optimum positions on the chip helps to reduce chip costs, processor delays, size and the like. Because the integrated circuits typically contain hundreds of thousands, if not millions of components, the task of optimizing the placement of components on a chip surface is typically not practical without the aid of computers.

Computer aided designs are effective to provide component location on the chip surface for minimizing interconnection distances, wire sizes, processing times and the like. The smallest functional unit placed on a chip surface is typically defined as a cell. A cell may be a single logic component of a larger logic tree or may be one or more logic trees. During the optimization process, different characteristics of the integrated circuit are tested to determine whether they meet the design criteria for the integrated circuit. If all of the tested characteristics of the integrated circuit meet all of the design criteria, then perhaps the design of the integrated circuit is not altered. More commonly, however, the characteristics of the integrated circuit are tested and then the design of the integrated circuit is modified in some specific manner, in an iterative procedure called optimization that is intended to optimize at least a given set of the tested characteristics, as referenced against the design criteria. This iterative procedure is often referred to as a resynthesis of the integrated circuit.

Because of the large number of computations involved, the resynthesis procedure of an integrated circuit design can be a very lengthy process. What is needed, therefore, is a system whereby the resynthesis procedures can be accomplished in a shorter length of time.

SUMMARY

The above and other needs are met by a method for resynthesizing a design of an integrated circuit using a parallel processing mode. A single processing mode is entered by activating a main thread and locking a semaphore associated with the main thread. The design of the integrated circuit is resynthesized using the main thread. Tasks to be accomplished in the parallel processing mode are identified. The semaphore associated with the main thread is unlocked, and the operation of the single processing mode is ceased. Ordinal threads are activated by unlocking a semaphore associated with each ordinal thread. The tasks are processed in parallel by assigning the tasks to the ordinal threads and the main thread.

Upon completion of one of the assigned tasks by one of the ordinal threads, it is determined whether an additional task remains to be assigned. In the case where the additional task remains, the additional task is assigned to the completed one of the ordinal threads. In the case where the additional task does not remain, the completed one of the ordinal threads is inactivated. Upon inactivation of all of the ordinal threads, a return is made to the single processing mode, with the ordinal threads remaining inactive unless and until the main thread identifies more tasks to be accomplished in the parallel processing mode.

By use of the semaphores, the tasks performed in parallel by the main thread and the ordinal threads remain in synchronization, thus facilitating the application of parallel processing to the resynthesis procedure. The tasks preferably include local optimization of clusters, including computation of at least one of net capacities, wire delays, and cell delays.

According to other aspects of the invention, a computing apparatus and a program for implementing the method as described above are provided.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

The present invention enables iterative procedures associated with resynthesis or optimization of an integrated circuit to be accomplished using parallel processing for at least some of the procedures. As used herein, parallel processing implies the concurrent accomplishment of tasks, such as by use of one or more processors, which can concurrently process multiple tasks. This is preferably accomplished using a multithreading processing system using a plurality of threads, wherein each thread represents different processing jobs that can run concurrently in a multi-threaded architecture. The threads used in the invention can be generally thought of as processor pathways that can process specific programs that are configured for performing a predetermined task. Each program becomes active on an assigned basis for a period of time as needed to complete or fail to complete the assigned task. The thread then returns to an inactive state.

For the purpose of example, one of the characteristics of the integrated circuit upon which resynthesis may be based is the timing of the integrated circuit. The timing of the integrated circuit relates generally to the temporal relationships between the various electrical signals that are applied at different times to different subsets of elements within the integrated circuit. For example, a given design for an integrated circuit typically specifies that certain electrical signals arrive at certain elements within the integrated circuit within specified time boundaries, in order for the integrated circuit to produce the proper response according to the design criteria.

Thus, testing of the integrated circuit for the proper temporal relationships of the applied and produced electrical signals, and then modifying the integrated circuit in an attempt to optimize those temporal relationships is called timing driven resynthesis herein. Goals of timing driven resynthesis include elimination of ramp time violations, minimizing path delays, and decreasing the total cell area. Because of the complexity of state of the art integrated circuits, the timing driven resynthesis process may include an extreme number of the iterative procedures described above and can take a considerable amount of time.

Thus, in a preferred embodiment, the present invention provides a timing-driven method for designing an integrated circuit, which method is preferably used in conjunction with a parallel processing computer system. In particular, the invention preferably includes parallelization of timing driven resynthesis procedures specific to the local optimization of clusters that occurs during the resynthesis procedure.

Figure 1:
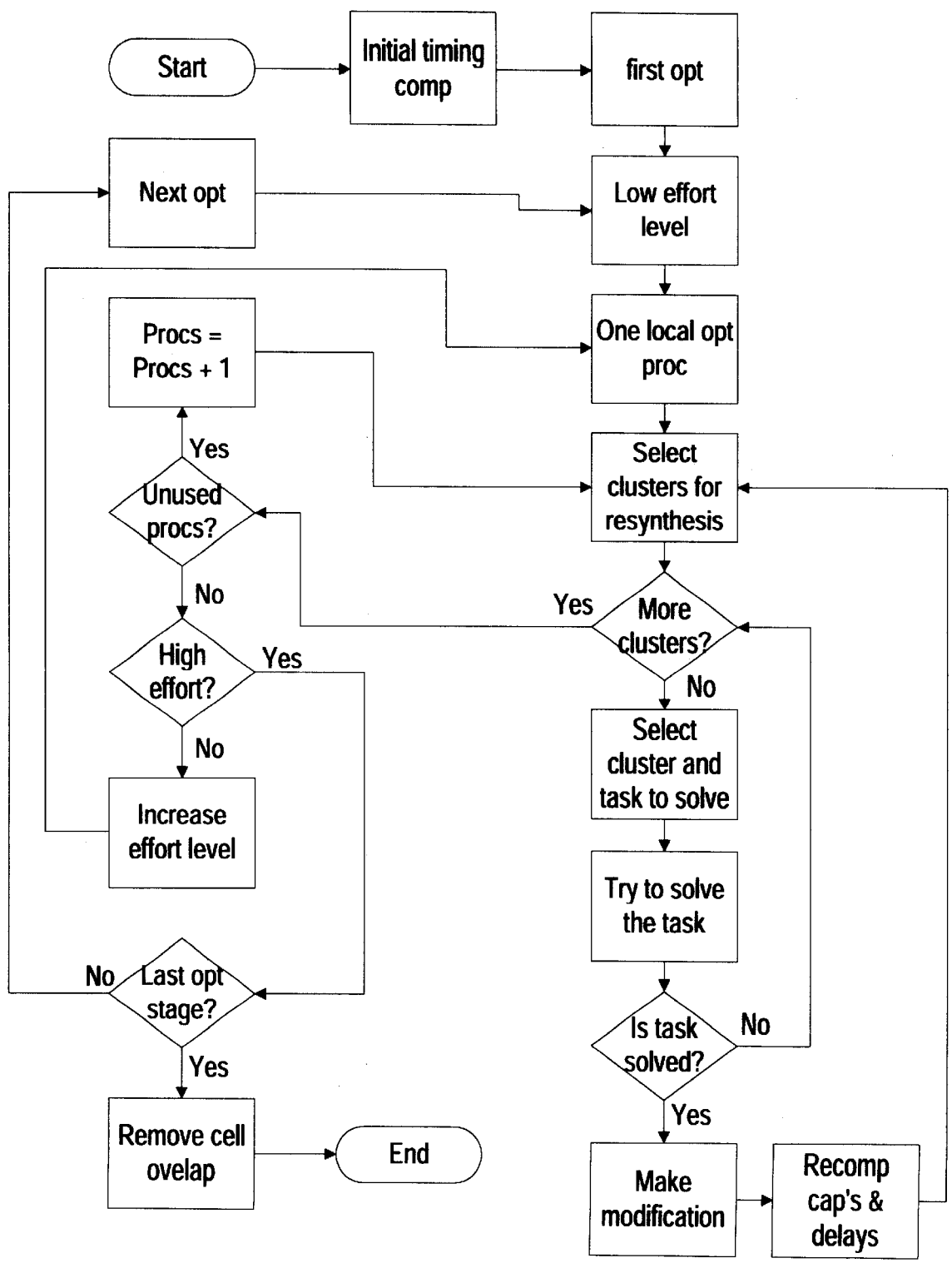
FIG. 1 is a flow chart showing preferred steps in timing driven resynthesis.

With initial reference to FIG. 1, there is shown a flow chart of preferred general steps in timing driven resynthesis. Timing driven resynthesis preferably includes the basic steps of initial computation of capacities and delays, general resynthesis, and overlap removal. Thus, the flow chart of FIG. 1 provides a framework for an understanding of the processes that may be accomplished using parallel processing, as described in more detail below.

The general resynthesis portion of timing driven resynthesis, which forms the majority of the steps depicted in FIG. 1, preferably includes the stages of ramp time optimization, timing optimization, and area optimization. Ramp time optimization generally includes reducing and preferably eliminating all ramp time violations of the integrated circuit. Timing optimization preferably minimizes the worst path delay. Area optimization preferably decreases the total cell area of the chip. Also, three effort levels—low, medium and high—are typically progressively applied to the optimization as needed to accomplish the goals of the resynthesis.

General resynthesis preferably accomplishes these objectives by applying local optimization procedures to small portions or clusters of the circuit. Preferred local optimization procedures include logic restructuring wherein logic trees are optimized, buffer optimization wherein trees of buffers and inverters are optimized, and cell resizing and replacement wherein single cells are optimized. Overlap removal is preferably performed following the general resynthesis.

The resynthesis procedure can not be parallelized easily. For example, it doesn't work well to cut up the chip into several parts and assign threads to optimize the parts independently, because of the very close connection between the parts. The result of a parallel resynthesis done in this manner tends to be much worse than the result of the resynthesis of the whole chip, done without parallelization. Thus, selection of the tasks to be accomplished in parallel tends to be very important to the overall success of the resynthesis.

However, as disclosed herein there are certain procedures in the resynthesis process, typically relatively small procedures that tend to be required frequently, that do lend themselves well to parallelization. For example, it has been found that parallelization of the computation or recomputation of the net capacities and of the wire and cell delays works well. Additionally, local optimization of clusters typically represents from about 65% to about 80% of the resynthesis time. Accordingly, significant time savings tend to be achieved by parallelization of this aspect of the timing driven resynthesis.

Figure 2:
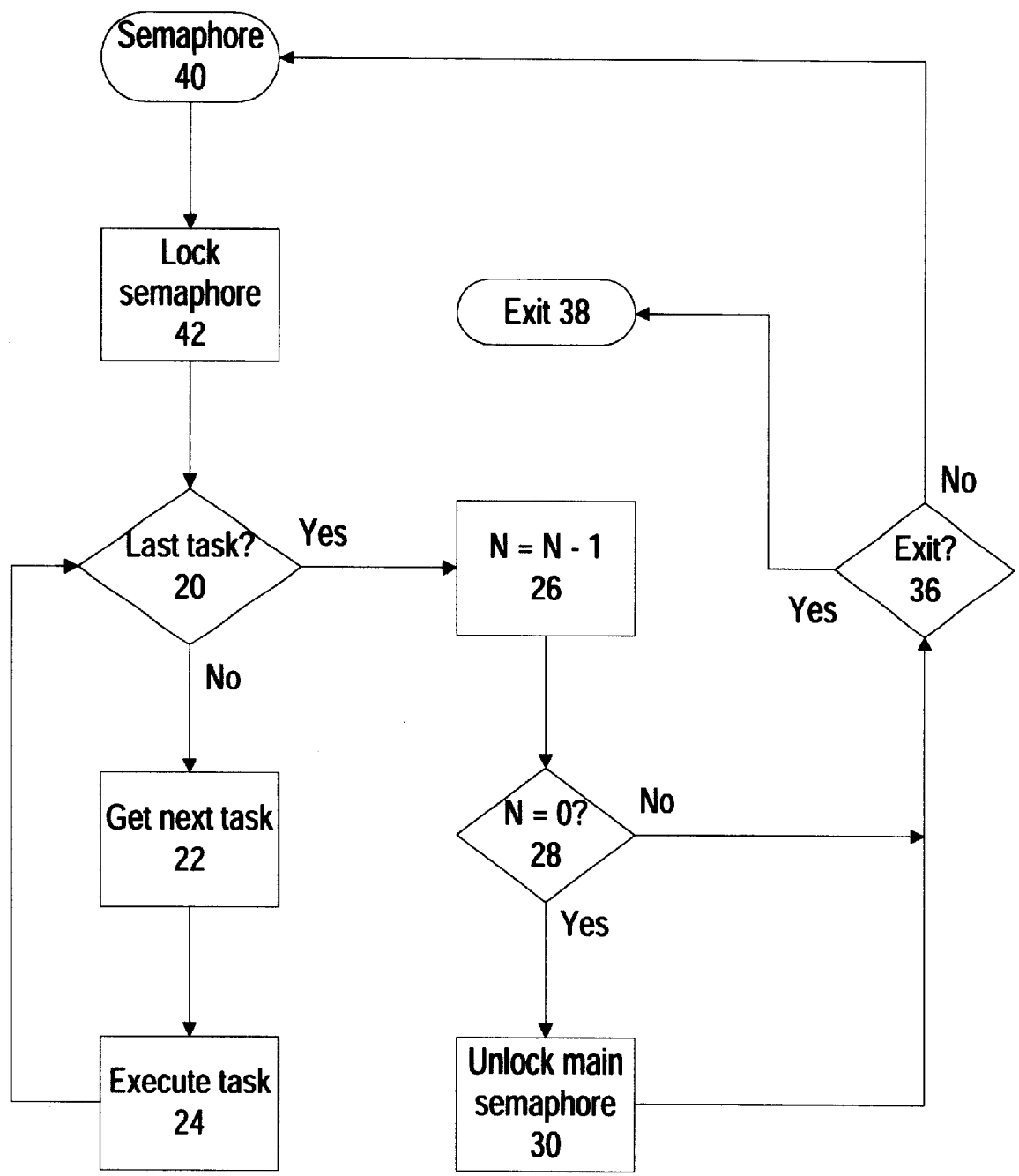
FIG. 2 is a flow chart of an ordinal thread in a parallel processing method in accordance with the invention.
Figure 3:
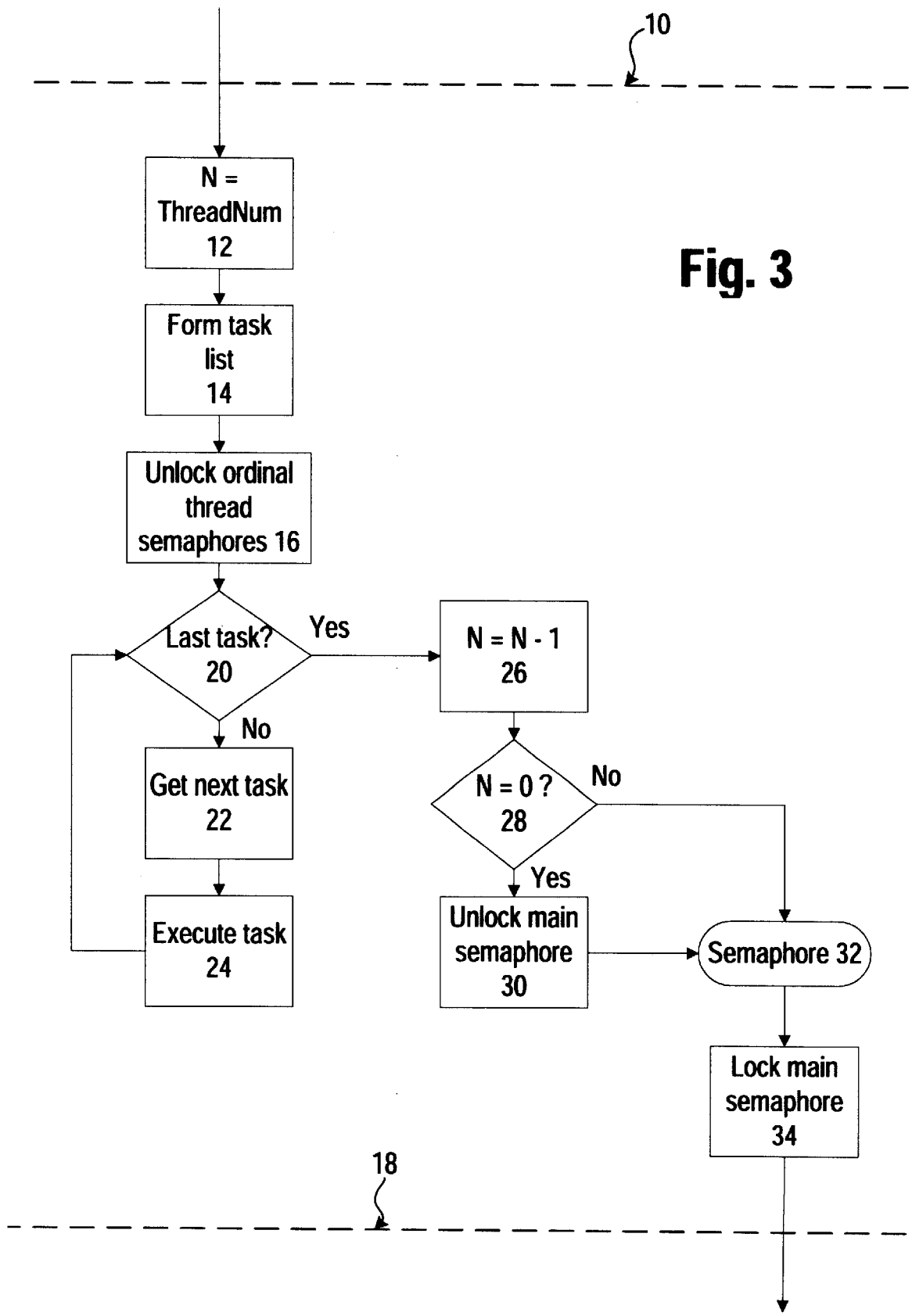
FIG. 3 is a flow chart of a main thread in a parallel processing method in accordance with the invention.

In accordance with the invention, and with reference to FIGS. 2 and 3, parallelization is accomplished by use of a single main thread and a plurality of ordinal threads. In the context of the preferred embodiment, wherein parallelization is preferably implemented for local optimization of clusters, it is understood that each ordinal thread preferably functions to optimize a cluster or a group of clusters, such that multiple clusters may be optimized concurrently to greatly expedite the time required for optimization. FIG. 2 is a flow chart for an ordinal thread and FIG. 3 is a flow chart for the main thread, wherein N represents the number of all active threads, including the main thread, and ThreadNum (FIG. 3) is the total number of threads.

The main thread is preferably active at the beginning of the resynthesis, while the ordinal threads are preferably all initially inactive. For example, in FIG. 3, above line 10 the main thread is preferably the only active thread. Activity of only the main thread is referred to as single threading.

When the main thread determines that a particular job or task can be parallelized, a routine to distribute the task is initiated. As a part of this routine, the number of active threads N is set equal to the number of threads, ThreadNum (block 12). The main thread then generates a list of tasks for the ordinal threads (block 14) and preferably activates all of the ordinal threads (block 16). The main thread preferably forms a list of cluster that should be optimized. A task for a thread is preferably a cluster with an assigned optimization procedure, as indicated above. The assigned procedure preferably depends on the type of the cluster. For example, if the cluster is a tree of logical cells, then the logic restructuring procedure is preferably used. If the cluster is a tree of buffers and inverters, then the buffer optimization procedure is preferably used. If the cluster is a single cell, then the resizing and replacement procedure is preferably used. Other optimization procedures that may be based at least in part on the composition of the cluster are also comprehended. Thus, to carry out the task is to apply the assigned optimization procedure to the assigned cluster.

All of the ordinal threads so activated and the main thread commence with their assigned tasks, with such multiple activity being referred to as multithreading. Each thread preferably becomes passive once it completes its task, while the main thread preferably continues its work by single threading or processing. Single threading preferably begins again below line 18 of FIG. 3, with the processes depicted between lines 10 and 18 representing multithreading or multiprocessing.

The tasks given to the threads to accomplish may be very different, one from another, and may also be quite complex. For example, in the case of performing a cell delay computation, a task may include computing the delays for a group of approximately fifty cells. It is appreciated that larger or smaller groups of cells may be included within the task, and that other procedures in addition to or instead of computing the delays may be assigned to the task.

The work of the threads is preferably synchronized as by semaphores. A semaphore in one form is a memory cell that is shared by two or more parallel processes which rely on each other for their continued operation. The semaphore provides communication between the parallel processes, and indicates when various events have taken place. The main thread and each ordinal thread preferably has its own semaphore. Semaphores have two states: locked and unlocked. If a semaphore is unlocked, then the thread goes through the semaphore without stopping and continues processing. If the semaphore is locked, the thread waits until some other thread unlocks the semaphore. An ordinal thread that is waiting is considered to be in a passive state. Once the main thread selects a list of tasks to be completed (block 14), it preferably unlocks the semaphores of all of the ordinal threads to activate them (block 16).

As the tasks are completed, the ordinal threads preferably return to their semaphores, find them to be locked, and thus become inactive. The main thread can preferably generate another list of tasks only when all of the ordinal threads are inactive. To finish the program, the main thread preferably sends an exit command to all ordinal threads. Returning to FIGS. 2 and 3, the foregoing is represented by blocks 20–42 thereof.

For example, in block 20, if the list of tasks is not empty, the entering thread is preferably assigned the next task (block 22) and proceeds to carry out the task (block 24). If, on the other hand, the list of tasks is empty, the number of active threads N is preferably decreased by one (block 26) and the ordinal thread returns to its semaphore (block 32) and is again passive. If this ordinal thread is the last active thread, or in other words if N=0 (block 28), then a signal is preferably generated to unlock the main semaphore (block 30). The main thread preferably can then (in block 32) either reactivate all of the ordinal threads and generate another list of tasks, or generate an exit signal, lock the main semaphore (block 34), and return to single processing, as represented by the arrow extending below dashed line 18.

Returning to block 30 in FIG. 2, the main thread may generate a signal to exit, such as if the multithreading is completed (block 36). If the main thread has not generated an exit signal, the ordinal thread preferably returns to its semaphore (block 40) and is inactive (block 42), or in other words the semaphore for the ordinal thread is locked.

If the cluster optimization is successful, or in other words, if a thread finds some possible solution for a cluster optimization task, the list of the tasks is preferably cleared and a command is preferably sent to all other threads to skip the optimization of their tasks, at which point they can not find any additional task to optimize, and they preferably become passive. The main thread then preferably changes the design of the integrated circuit as per the solution found by the thread in the optimization procedure assigned, and makes the timing recomputation. The main thread then preferably forms a new list of the cluster to be optimized, as activates the ordinal threads to start the optimization again.

The foregoing description of preferred embodiments for this invention have been presented for purposes of illustration and description. They are not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as is suited to the particular use contemplated. All such modifications and variations are within the scope of the invention as determined by the appended claims when interpreted in accordance with the breadth to which they are fairly, legally, and equitably entitled.

What is claimed is:

1. A method for resynthesizing a design of an integrated circuit using a parallel processing mode, comprising the steps of:
   (a) entering a single processing mode by activating a main thread and locking a semaphore associated with the main thread,
   (b) resynthesizing the design of the integrated circuit using the main thread,
   (c) identifying tasks to be accomplished in the parallel processing mode,
   (d) unlocking the semaphore associated with the main thread,
   (e) ceasing operation of the single processing mode,
   (f) activating ordinal threads by unlocking a semaphore associated with each ordinal thread,
   (g) processing the tasks in parallel by assigning the tasks to the ordinal threads and the main thread,
   (h) upon completion of one of the assigned tasks by one of the ordinal threads, determining whether an additional task remains to be assigned,
   (i) in the case where the additional task remains, then assigning the additional task to the completed one of the ordinal threads,
   (j) in the case where the additional task does not remain, then inactivating the completed one of the ordinal threads, and
   (k) upon inactivation of all of the ordinal threads, returning to the single processing mode, with the ordinal threads remaining inactive unless and until the main thread identifies more tasks to be accomplished in the parallel processing mode.

2. The method of claim 1, wherein the tasks include computation of at least one of net capacities, wire delays, and cells delays.

3. The method of claim 1, wherein the tasks include local optimization of clusters.

4. A computerized processing system for resynthesizing a design of an integrated circuit using a parallel processing mode, comprising:
   (a) an input for receiving information in regard to the design of the integrated circuit,
   (b) a memory for storing the information in regard to the design of the integrated circuit, and for storing processing commands, and
   (c) a processor for implementing the processing commands stored in the memory, whereby the processor by processing the processing commands creates a main thread and a plurality of ordinal threads, and a semaphore for the main thread and each of the ordinal threads for synchronizing operation of the main and ordinal threads, where each semaphore has a locked mode and an unlocked mode, the processor for implementing the processing commands to accomplish the steps of;
      1. operating the main thread in a single processing optimization step wherein its semaphore is locked,
      2. unlocking the semaphore for the main thread and ceasing operation of the single processing optimization step and generating a list of tasks for the ordinal threads with the main thread and activating all of the ordinal threads by unlocking their semaphores with the main thread, wherein each of the ordinal threads and the main thread accomplish tasks from the list of tasks in a multithreading optimization step,
      3. upon completion by each ordinal thread of its assigned task, determining whether additional tasks remain, and in the case where additional tasks remain then assigning each completed ordinal thread another task from the list of tasks, and in the case where additional tasks do not remain then inactivating each completed ordinal thread, and
      4. upon completion of all the tasks of the list of tasks, generating an exit command with the main thread and returning to single processing, with each of the ordinal threads remaining inactive unless and until the main thread generates another list of tasks and again activates the ordinal threads.

5. The computerized processing system of claim 4, wherein the tasks include computation of at least one of net capacities, wire delays, and cells delays.

6. The computerized processing system of claim 4, wherein the tasks include local optimization of clusters.

7. A computer program on a computer readable media, the computer program physically embodying a method of resynthesizing a design of an integrated circuit using a parallel processing mode, the computer program comprising logic elements for:

(a) entering a single processing mode by activating a main thread and locking a semaphore associated with the main thread, (b) resynthesizing the design of the integrated circuit using the main thread, (c) identifying tasks to be accomplished in the parallel processing mode, (d) unlocking the semaphore associated with the main thread, (e) ceasing operation of the single processing mode, (f) activating ordinal threads by unlocking a semaphore associated with each ordinal thread, (g) processing the tasks in parallel by assigning the tasks to the ordinal threads and the main thread, (h) upon completion of one of the assigned tasks by one of the ordinal threads, determining whether an additional task remains to be assigned, (i) in the case where the additional task remains, then assigning the additional task to the completed one of the ordinal threads, (j) in the case where the additional task does not remain, then inactivating the completed one of the ordinal threads, and (k) upon inactivation of all of the ordinal threads, returning to the single processing mode, with the ordinal threads remaining inactive unless and until the main thread identifies more tasks to be accomplished in the parallel processing mode.

8. The computer program of claim 7, wherein the tasks include computation of at least one of net capacities, wire delays, and cells delays.

9. The computer program of claim 7, wherein the tasks include local optimization of clusters.

* * * * *